United States Patent
Jung et al.

(10) Patent No.: US 8,569,615 B2
(45) Date of Patent: Oct. 29, 2013

(54) SOLAR CELLS AND METHODS OF FORMING THE SAME

(75) Inventors: Mi Hee Jung, Daejeon (KR); Mangu Kang, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 198 days.

(21) Appl. No.: 13/014,814

(22) Filed: Jan. 27, 2011

(65) Prior Publication Data
US 2012/0067413 A1    Mar. 22, 2012

(30) Foreign Application Priority Data
Sep. 16, 2010 (KR) .................. 10-2010-0091202

(51) Int. Cl.
*H01L 31/00* (2006.01)

(52) U.S. Cl.
USPC ........... 136/256; 136/257; 136/263; 136/259; 438/63; 438/72; 438/99; 977/773; 977/811; 977/827; 977/834; 977/932; 977/720; 977/701; 257/40; 257/414; 257/431; 257/432; 257/437

(58) Field of Classification Search
USPC .................................................. 136/243–265
See application file for complete search history.

(56) References Cited

U.S. PATENT DOCUMENTS

| | | | | |
|---|---|---|---|---|
| 4,422,721 A | * | 12/1983 | Hahn et al. | 359/585 |
| 2005/0067009 A1 | * | 3/2005 | Lee et al. | 136/263 |
| 2007/0107775 A1 | * | 5/2007 | Choi et al. | 136/263 |
| 2009/0231714 A1 | * | 9/2009 | Zhao et al. | 359/601 |
| 2010/0001359 A1 | * | 1/2010 | Jung et al. | 257/458 |
| 2013/0129974 A1 | * | 5/2013 | Huang et al. | 428/141 |
| 2013/0171753 A1 | * | 7/2013 | Wang | 438/27 |

FOREIGN PATENT DOCUMENTS

| | | | |
|---|---|---|---|
| CN | 101962269 A | * | 2/2011 |
| JP | 2005-108836 A | | 4/2005 |
| KR | 10-2010-0021540 A | | 2/2010 |
| KR | 10-2010-0049725 A | | 5/2010 |
| KR | 10-0986911 | | 10/2010 |
| WO | WO 2009085878 A1 | * | 7/2009 |
| WO | WO 2012157853 A2 | * | 11/2012 |

OTHER PUBLICATIONS

Perry, R.H.; Green, D.W. (1997). Perry's Chemical Engineers' Handbook (7th Edition). (pp. 2-26-2-27). McGraw-Hill. Online version available at: http://www.knovel.com/web/portal/browse/display?_EXT_KNOVEL_DISPLAY_bookid=48&VerticalID=0.*
US Research Nanomaterials, Inc. "Zinc Oxide Nanopowder/Nanoparticles (ZnO, 99.9+%, 80-200 nm)", http://www.us-nano.com/inc/sdetail/349, retrieved Nov. 27, 2012.*
Wan et al. "Antireflective Nanoparticle Arrays Enhance the Efficiency of Silicon Solar Cells." Adv. Funct. Mater. 2010, 20, 3064-3075.*

(Continued)

*Primary Examiner* — Alicia Toscano
*Assistant Examiner* — Liesl C Baumann
(74) *Attorney, Agent, or Firm* — Rabin & Berdo, P.C.

(57) ABSTRACT

Provided are solar cells and methods of forming the same. The solar cell includes an anti-reflection layer on a substrate, a first electrode on the anti-reflection layer, a photo-electro conversion layer on the first electrode, and a second electrode on the photo-electro conversion layer.

10 Claims, 14 Drawing Sheets

(56) References Cited

OTHER PUBLICATIONS

Yodyingyong et al. "ZnO nanoparticles and nanowire array hybrid photoanodes for dyesensitized solar cells." Appl. Phys. Lett. 96, 073115 (2010).*

Krogman et al. "Anti-reflective optical coatings incorporating nanoparticles." Nanotechnology 16 (2005) S338-S343.*

Coakley, Martha. "Growth and Optical Characterization of Zinc Oxide Nanowires for Anti-Reflection Coatings for Solar Cells." Masters of Science in Physics Thesis, Portland State University, Portland, OR, 2011.*

Zheng, et al. "Novel ZnO-Based Film with Double Light-Scattering Layers as Photoelectrodes for Enhanced Efficiency in Dye-Sensitized Solar Cells." Chem. Mater. 2010, 22, 928-934.*

Cheng, et al. "Formation of Branched ZnO Nanowires from Solvothermal Method and Dye-Sensitized Solar Cell Applications." J. Phys. Chem. C, 2008, 112, 16359-16364.*

Lee, et al. "ZnO Nanostructures as Efficient Antireflection Layers in Solar Cells." Nano Letters, 2008, vol. 8, No. 5, 1501-1505.*

Nagy, et al. "Zinc Oxide LB Films with Improved Antireflective, Photoactive and Mechanical Properties." Progr Colloi Polym Sci (2008) 135: 107-118.*

Kim, et al. "Tunable, Flexible Antireflection Layer of ZnO Nanowires Embedded in PDMS." Langmuir 2010, 26(10), 7552-7554.*

English abstract of CN 101962269 A.*

J. Zhu, et al., "Nanodome Solar Cells with Efficient Light Management and Self-Cleaning", Nano Letter, vol. 10, 1979-1984(2010).

* cited by examiner

SOLAR CELLS AND METHODS OF FORMING THE SAME

CROSS-REFERENCE TO RELATED APPLICATIONS

This U.S. non-provisional patent application claims priority under 35 U.S.C. §119 of Korean Patent Application No. 10-2010-0091202, filed on Sep. 16, 2010, the entire contents of which are hereby incorporated by reference.

BACKGROUND OF THE INVENTION

The present invention disclosed herein relates to solar cells and methods of forming the same, and more particularly, to dye-sensitized solar cells and methods of forming the same.

Solar cells are semiconductor devices that directly convert photovoltaic energy into electrical energy. The solar cells may be divided into solar cells that are formed of inorganic materials such as silicon or compound semiconductors, and dye-sensitized solar cells in which a dye is absorbed into a nanocrystal oxide particle surface, according to materials. Moreover, the solar cells may be divided into semiconductor pn junction solar cells and semiconductor/liquid photoelectrochemical solar cells according to the cell structures thereof.

In such solar cells, by maximizing the number of photons that reach an active layer, efficiencies of the solar cells can be enhanced. Alternatively, by minimizing the loss due to reflection, efficiencies of the solar cells can be improved.

SUMMARY OF THE INVENTION

The present invention may provide solar cells which improve efficiency and a method of forming the same.

Embodiments of the present invention may provide a solar cell including: an anti-reflection layer on a substrate; a first electrode on the anti-reflection layer; a photo-electro conversion layer on the first electrode; and a second electrode on the photo-electro conversion layer, wherein the anti-reflection layer includes a nanopattern on the substrate, and a nanostructure having a refractive index lower than a refractive index of the first electrode on the nanopattern.

In some embodiments, the nanopattern may include a transparent conductive oxide.

In other embodiments, the nanopattern may include fluorine-doped tin oxide.

In still other embodiments, the nanopattern may have a shape of a nanopillar having a concave-convex part.

In even other embodiments, the nanostructure may include zinc oxide.

In yet other embodiments, the nanostructure may include a nanoparticle layer.

In further embodiments, the nanoparticle layer may include a nanopore.

In still further embodiments, the nanostructure may include a nanorod layer.

In even further embodiments, the nanopattern and the first electrode may include the same material.

In yet further embodiments, the nanopattern and the first electrode may include a transparent conductive oxide.

In much further embodiments, the photo-electro conversion layer may include: a semiconductor electrode layer on the first electrode; and an electrolyte layer on the semiconductor electrode layer.

In other embodiments of the present invention, a method of forming a solar cell, the method includes: forming a transparent conductive oxide layer on a substrate; patterning the transparent conductive oxide layer to form a nanopattern; forming a nanoparticle layer on the nanopattern; and forming a first electrode on the nanoparticle layer.

In some embodiments, the forming of a nanopattern may include: forming a monolayer on the transparent conductive oxide layer using a polystyrene nanoparticle or a silicon oxide nanoparticle; and patterning the transparent conductive oxide layer using the polystyrene nanoparticle or the silicon oxide nanoparticle as a mask.

In other embodiments, the forming of a nanoparticle layer may include: dissolving a zinc oxide precursor in an organic solvent to form solution; doping the solution on the substrate; and heating the substrate to remove the organic solvent.

In still other embodiments, the first electrode may be formed as a transparent conductive oxide.

In even other embodiments, the method may further include: forming a semiconductor electrode layer on the first electrode; and forming an electrolyte layer on the semiconductor electrode layer.

In still other embodiments of the present invention, a method of forming a solar cell includes: forming a transparent conductive oxide layer on a substrate; patterning the transparent conductive oxide layer to form a nanopattern; forming a nanorod layer on the nanopattern; and forming a first electrode on the nanorod layer.

In some embodiments, the forming of a nanorod layer may include: forming a nanoparticle layer on the nanopattern; and growing the nanoparticle layer by using the nanoparticle layer as a seed layer.

In other embodiments, the method may further include: forming a semiconductor electrode layer on the first electrode; and forming an electrolyte layer on the semiconductor electrode layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
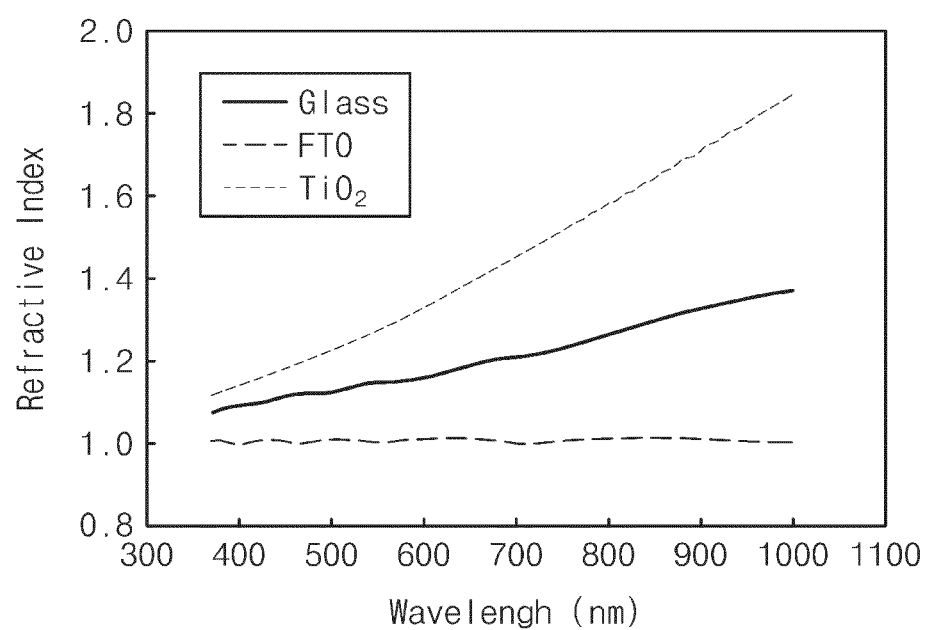
FIG. 1 is a graph for describing loss by reflection in accordance with refractive indexes of materials which are used in a solar cell.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, it will be understood that when an element is referred to as being 'on' another element, it can be directly on the other element, or intervening elements may also be present. Also, in the figures, the dimensions of layers and regions are exaggerated for clarity of illustration. Like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Also, though terms like a first, a second, and a third are used to describe various regions and layers in various embodiments of the present invention, the regions and the layers are not limited to these terms. These terms are used only to discriminate one region or layer from another region or layer. An embodiment described and exemplified herein includes a complementary embodiment thereof.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1 is a graph for describing loss by reflection in accordance with refractive indexes of materials which are used in a solar cell.

Referring to FIG. 1, the refractive index of titanium dioxide ($TiO_2$) that is used as the electrode dots of a semiconductor electrode layer may be higher than that of a glass used as a substrate. Also, Fluorine-doped Tin Oxide (FTO) used as an electrode may be disposed between the glass substrate and the semiconductor electrode layer. The refractive index of an FTO thin film may be lower than that of the glass substrate. Accordingly, light that passes through the glass substrate may be reflected by the FTO thin film, thereby decreasing a light absorption rate.

Figure 2A:
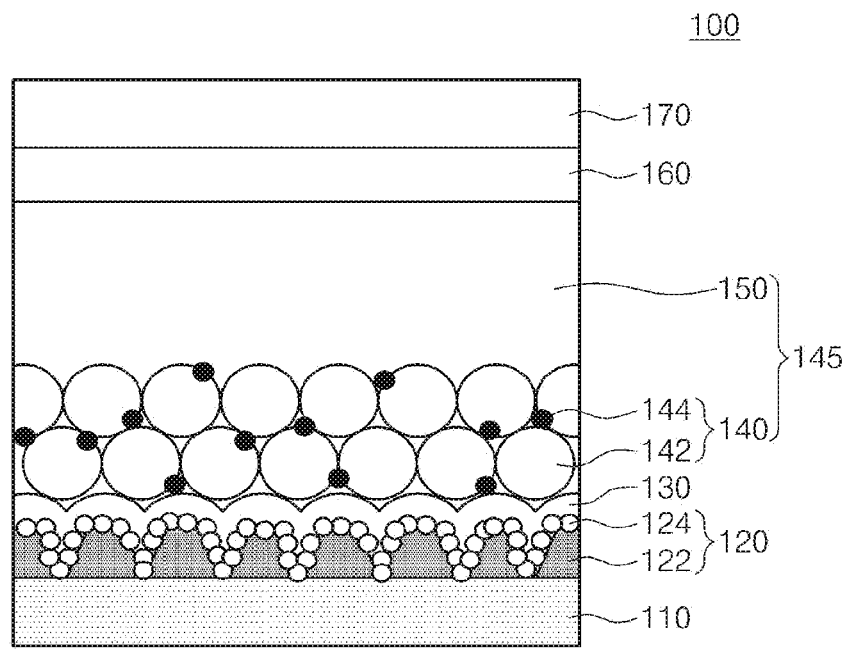
FIG. 2A is a cross-sectional view illustrating a solar cell according to an embodiment of the present invention.

FIG. 2A is a cross-sectional view illustrating a solar cell according to an embodiment of the present invention.

Referring to FIG. 2A, a solar cell 100 may include a first substrate 110, an anti-reflection layer 120 on the first substrate 110, a first electrode 130 on the anti-reflection layer 120, an optic-electro conversion layer 145 on the first electrode 130, and a second electrode 160 on the optic-electro conversion layer 145. The first substrate 110 may include a glass. The anti-reflection layer 120 may include a nanopattern 122, and a nanoparticle layer 124 on the nanopattern 122.

The nanopattern 122 may include a transparent conductive oxide. For example, the nanopattern 122 may be FTO film. The nanopattern 122 may have the shapes of nanopillars having a concave-convex part. The nanopattern 122 can reduce the reflection of light and enhance light transmissivity.

The nanoparticle layer 124 may include zinc oxide. The nanoparticle layer 124 may include a nanopore. Since the nanoparticle layer 124 includes the nanopore, the reflection of light can be reduced in the surface of the nanoparticle layer 124. The nanoparticle layer 124 may be stacked along the shape of the upper surface of the nanopattern 122. The first electrode 130 may be disposed on the nanoparticle layer 124. The first electrode 130 may include the same material as that of the nanopattern 122. The first electrode 130 may include a transparent conductive oxide, for example, an FTO. The refractive index of the nanoparticle layer 124 may be lower than that of the first electrode 130. Accordingly, the nanoparticle layer 124 can cause the destructive interference of light, thereby decreasing the reflection of light.

The optic-electro conversion layer 145 may include a semiconductor electrode layer 140, and an electrolyte layer 150 on the semiconductor electrode layer 140. The semiconductor electrode layer 140 may include electrode dots 142, and a dye layer 144 which is absorbed into the surfaces of the electrode dots 142. The electrode dots 142, for example, may include particles that are formed of titanium oxide. The dye layer 144 may be a ruthenium complex. The electrolyte layer 150, for example, may be a redox iodide electrolyte. The second electrode 160 may include a transparent conductive oxide, for example, an FTO. A second substrate 170 may be further included on the second electrode 160. The second substrate 170 may be a glass.

According to an embodiment of the present invention, the anti-reflection layer 120 may include a nanopattern 122 and a nanoparticle layer 124. The nanoparticle layer 124 can decrease the reflection of light due to the destructive interference of light, and the nanopattern 122 can enhance light transmissivity. Accordingly, the light absorption rate and efficiency of the solar cell can improve and increase.

Figure 2B:
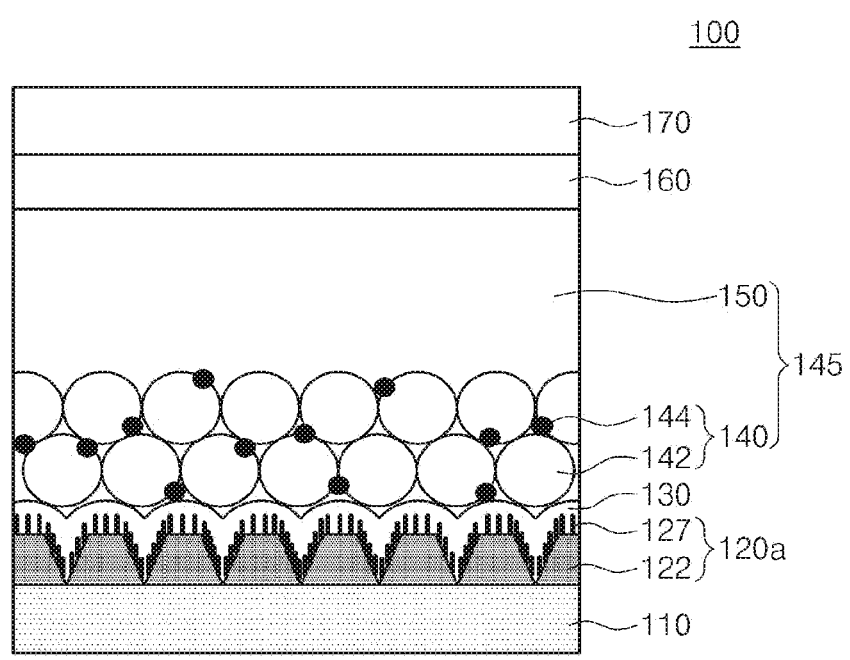
FIG. 2B is a cross-sectional view illustrating a solar cell according to another embodiment of the present invention.

FIG. 2B is a cross-sectional view illustrating a solar cell according to another embodiment of the present invention. Hereinafter, for conciseness, the technical features that have been described above with reference to FIG. 2A will be omitted.

Referring to FIG. 2B, unlike in FIG. 2A, an anti-reflection layer 120a may include a nanopattern 122, and a nanorod layer 127 on the nanopattern 122. The nanorod layer 127 may include zinc oxide. The nanorod layer 127 can decrease interference fringe, thereby minimizing the reflection of light. The nanorod layer 127 may have a refractive index lower than that of the first electrode 130. According to another embodiment of the present invention, the nanorod layer 127 is provided, and thus the reflection of light can be minimized.

Figure 4A:
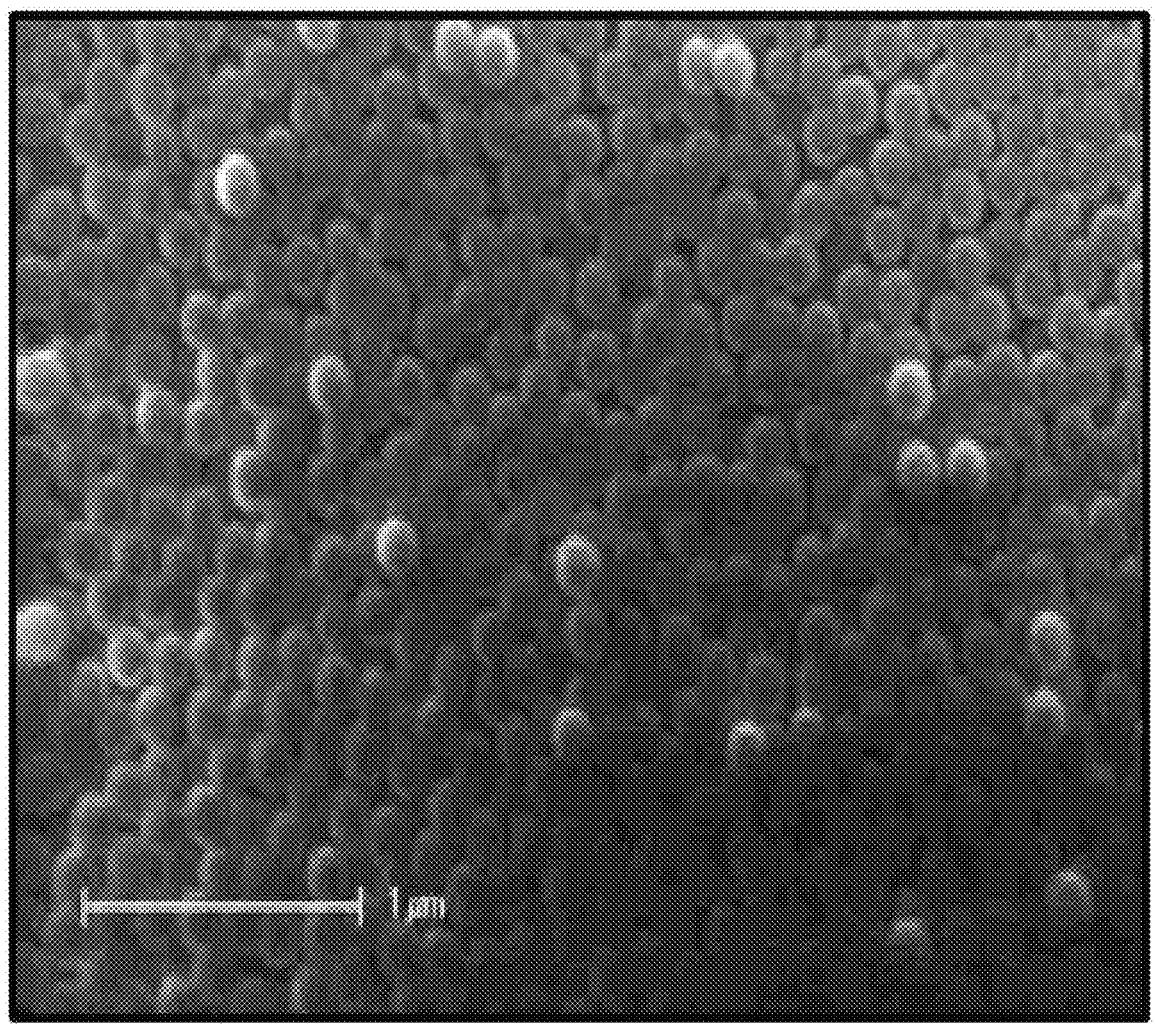
FIGS. 4A and 4B are images illustrating a state where a polystyrene nanoparticle has been formed.
Figure 4B:
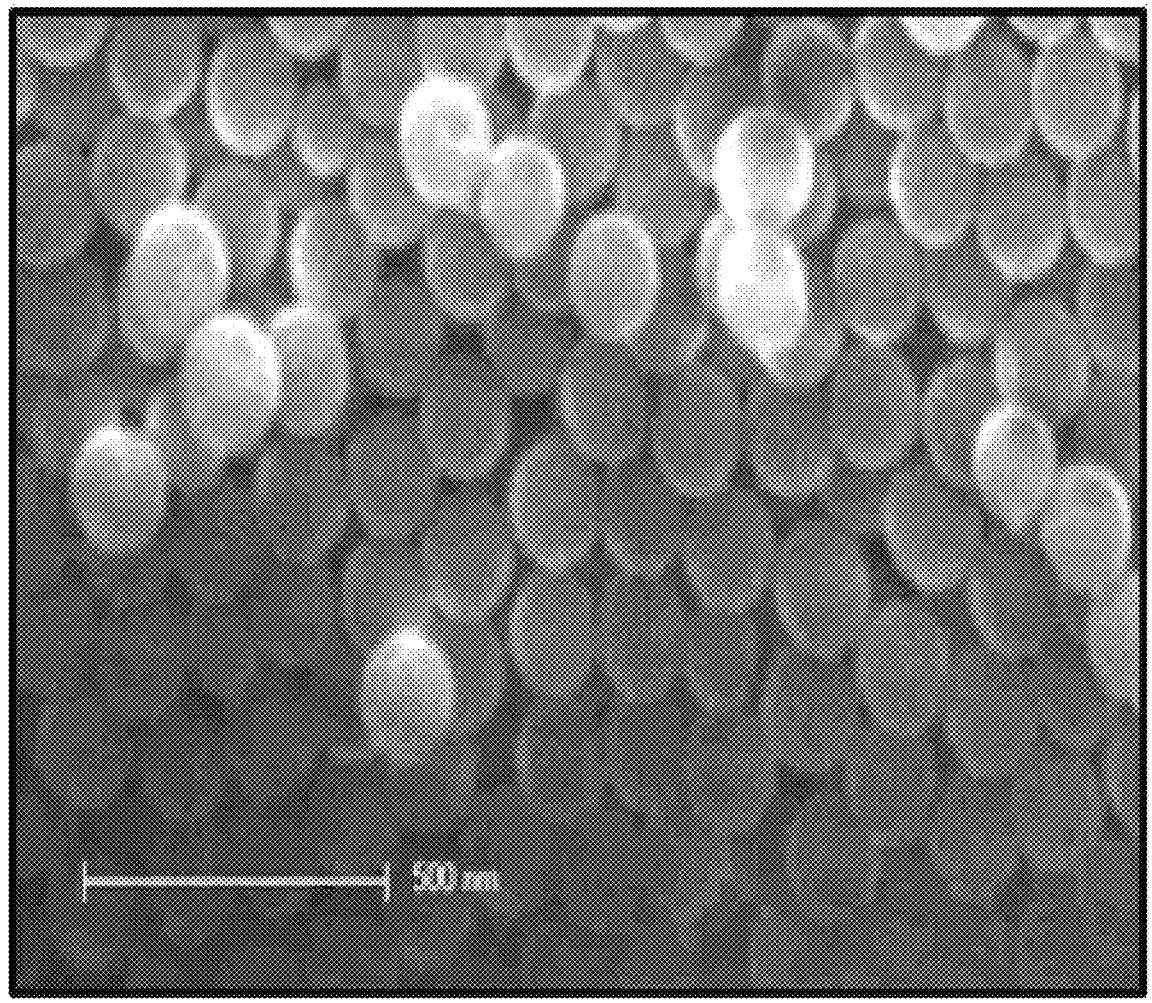
Figure 4C:
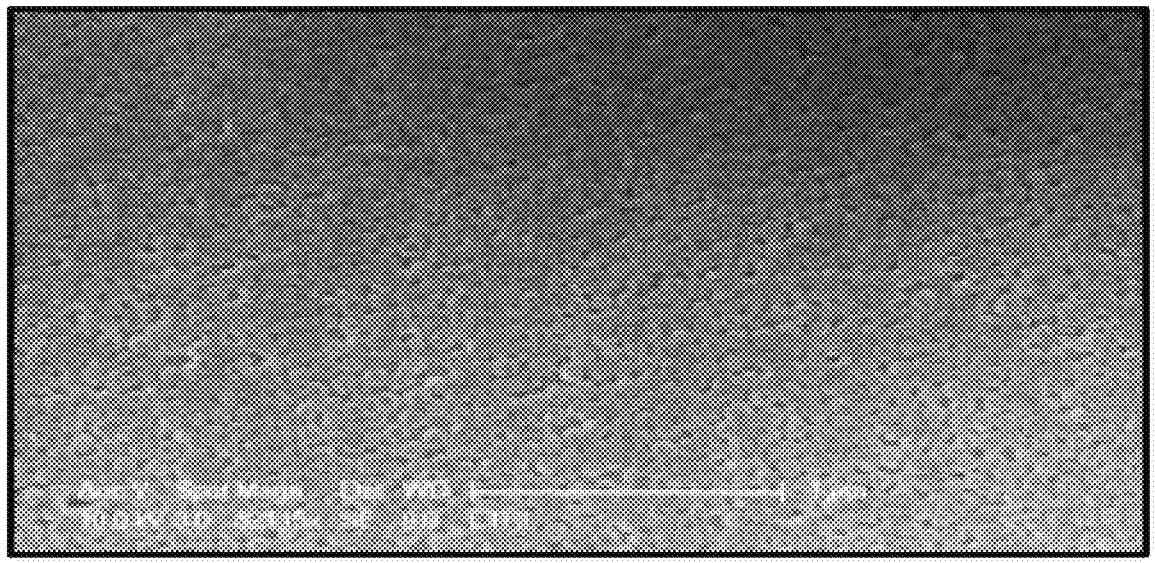
FIGS. 4C and 4D are images illustrating a state where a silicon oxide nanoparticle has been formed.
Figure 4D:
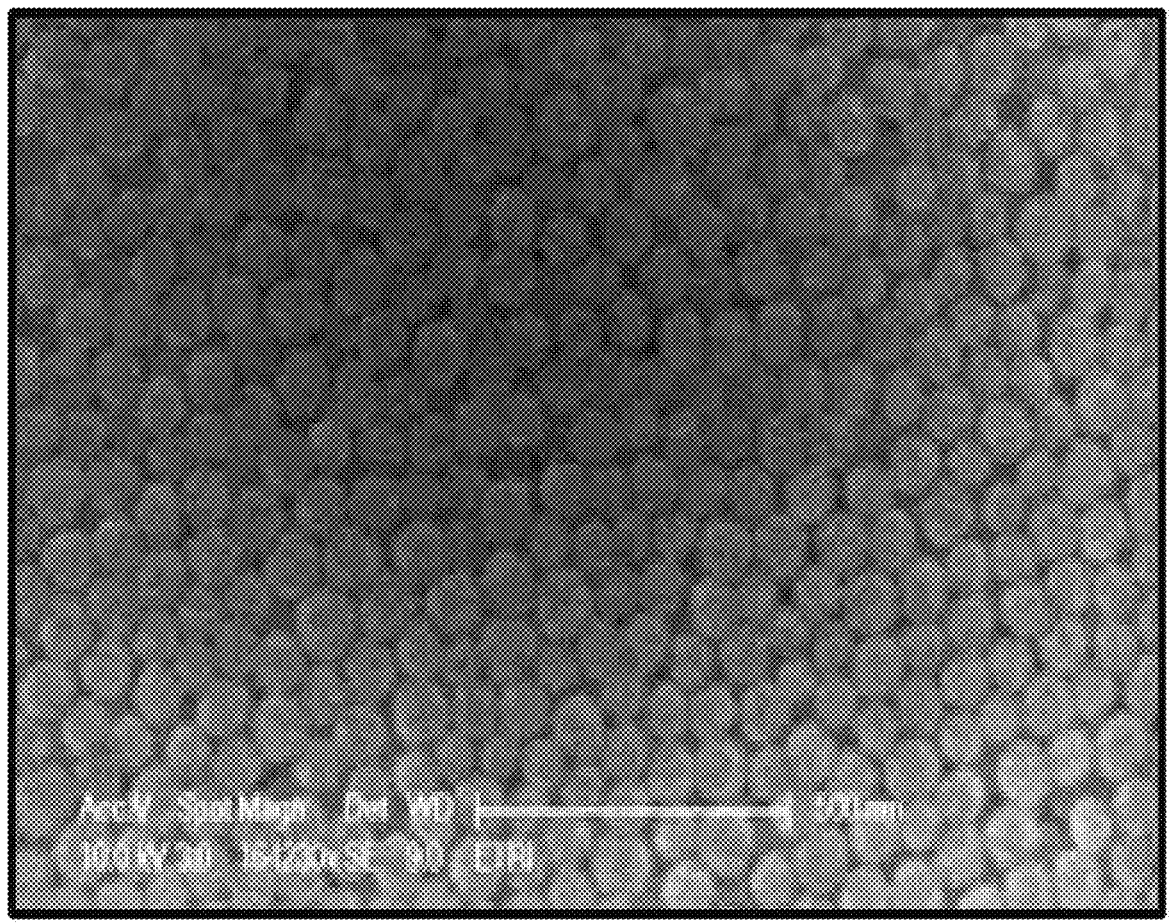
Figure 5A:
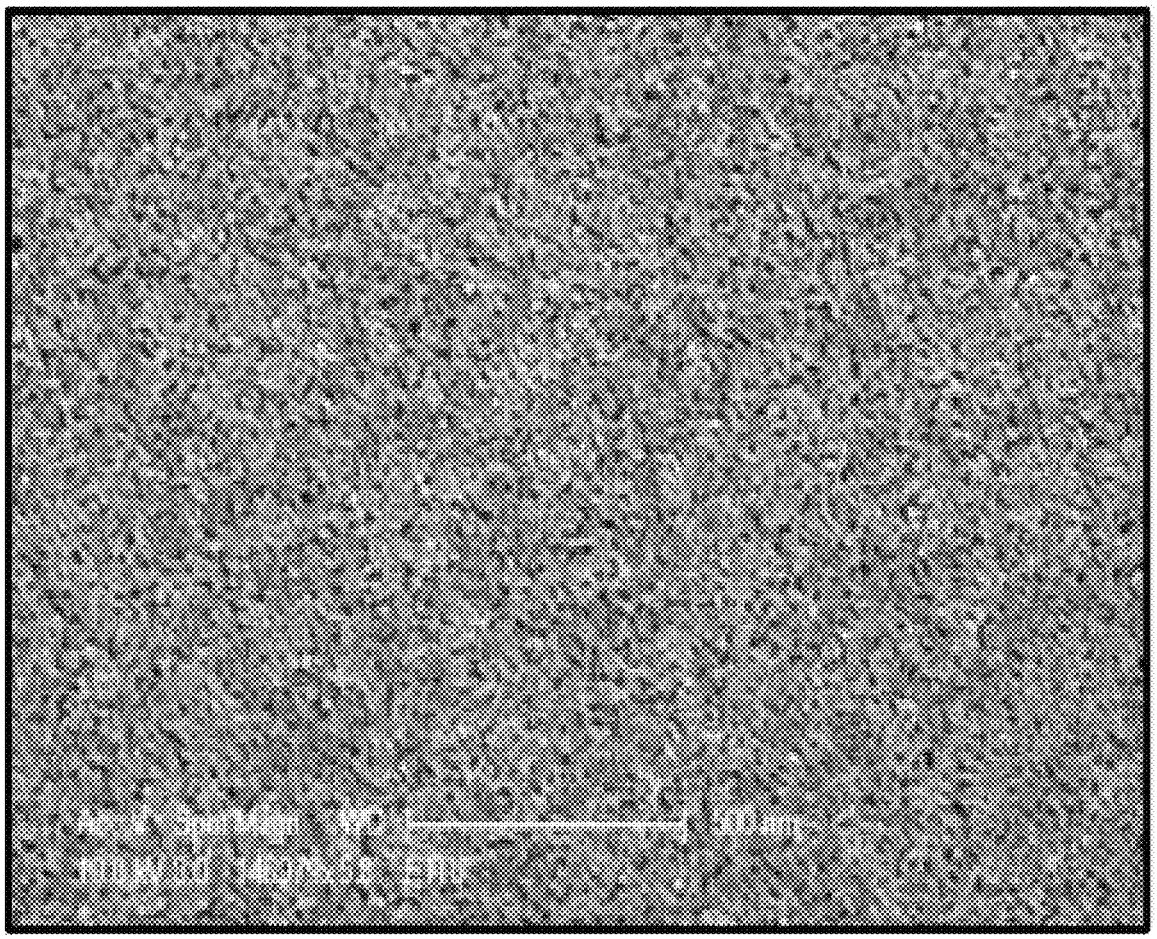
FIGS. 5A and 5B are images illustrating a state where a nanoparticle has been formed.
Figure 5B:
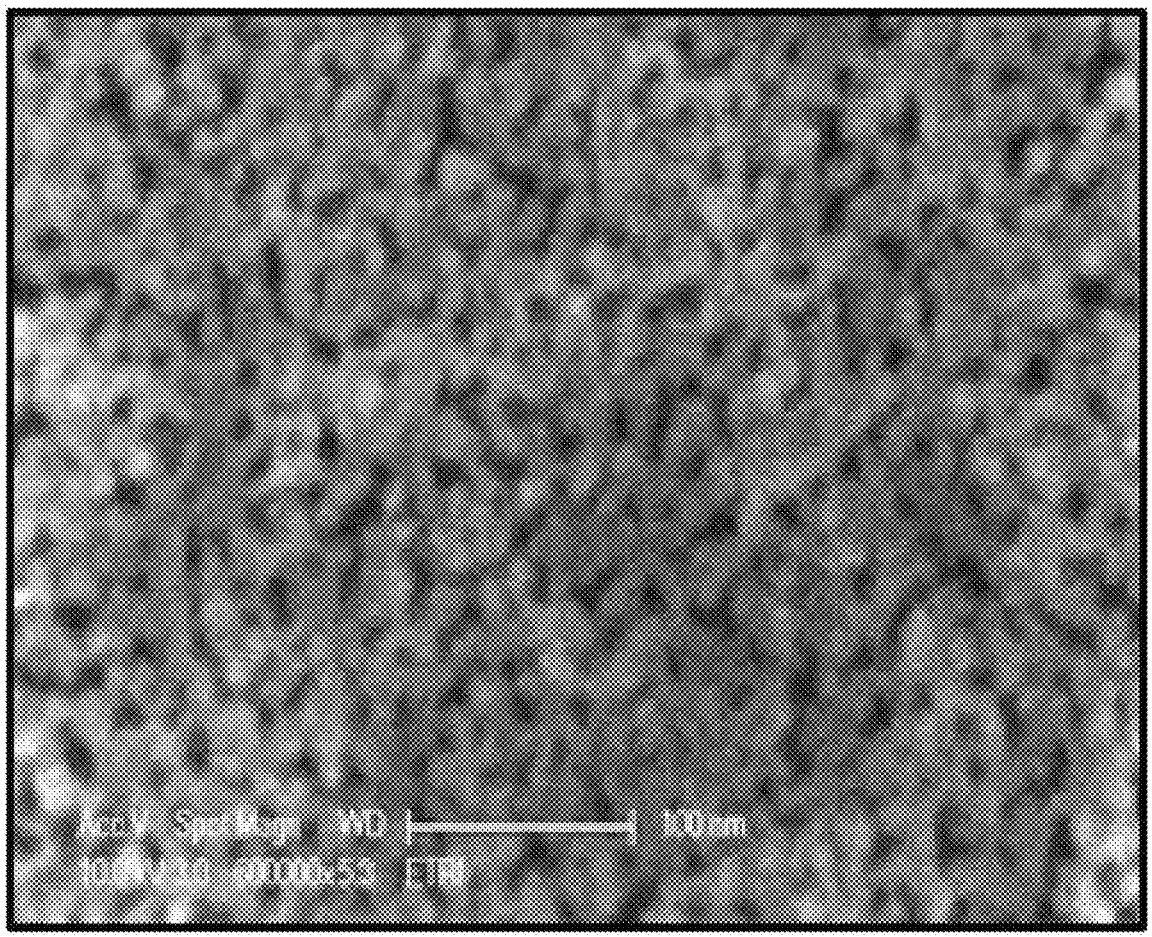

FIGS. 3A to 3D are cross-sectional views illustrating a method of forming a solar cell, according to an embodiment of the present invention. FIGS. 4A and 4B are images illustrating a state where a polystyrene nanoparticle has been formed (FIG. 4B is an enlarged view of FIG. 4A). FIGS. 4C and 4D are images illustrating a state where a silicon oxide nanoparticle has been formed (FIG. 4D is an enlarged view of FIG. 4C). FIGS. 5A and 5B are images illustrating a state where a nanoparticle has been formed (FIG. 5B is an enlarged view of FIG. 5A).

Figure 3A:
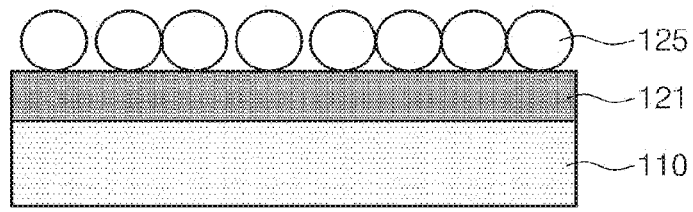
FIGS. 3A to 3D are cross-sectional views illustrating a method of forming a solar cell, according to an embodiment of the present invention.

Referring to FIG. 3A, a transparent conductive oxide layer 121 may be formed on the substrate 110. The transparent conductive oxide layer 121 may include FTO. A monolayer may be formed on the transparent conductive oxide layer 121 by using a polystyrene nanoparticle or silicon oxide nanoparticle 125.

Figure 3B:
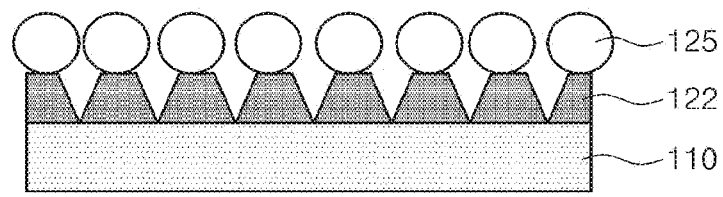

Referring to FIG. 3B, the nanopattern 122 may be formed by patterning the transparent conductive oxide layer 121 using the polystyrene nanoparticle or silicon oxide nanoparticle 125 as a mask. The nanopattern 122 may be formed in a Reactive Ion Etching (RIE) process that uses inductively-coupled plasma. The RIE process may be performed with $SF_6$ gas (30 sccm) and $CHF_3$ gas, in a condition that has 30 mtorr, a Radio Frequency (RF) power of 100 W and a ten-minute process. The polystyrene nanoparticle or silicon oxide nanoparticle 125 may be removed in a process of forming the nanopattern 122. That is, the polystyrene nanoparticle or silicon oxide nanoparticle 125 may be removed by performing the RIE process.

Figure 3C:
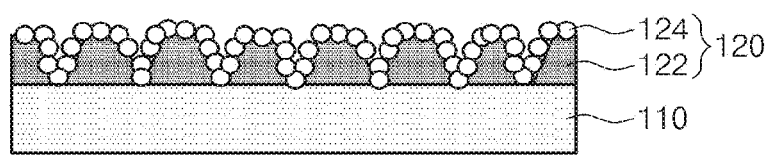

Referring to FIG. 3C, a nanoparticle layer 124 may be formed on the nanopattern 122. The nanoparticle layer 124 may be formed of zinc oxide. The nanoparticle layer 124 may be formed with a zinc oxide precursor. Solution may be formed by melting zinc acetate dehydrate of 0.2 M in an organic solvent that is generated by mixing methanol and 2-methoxyethanol at a volume of 1:1, the solution may be doped over the substrate 110, the organic solvent may be removed by heating the solution in a hot plate, and thus the zinc oxide precursor may be formed. For example, the solution may be doped over the substrate 110 for about 30 seconds at about 3000 rpm, and be heated for 10 minutes at about 80° C. in the hot plate. Such a process, for example, may be repeated several times or 3 to 5 times, and may heat the substrate 110 for one hour at about 350° C. A nanopore may be formed in the nanoparticle layer 124 (see FIGS. 5A and 5B), and the surface of the nanoparticle layer 124 can decrease the reflection of light. The nanoparticle layer 124 and the nanopattern 122 may configure an anti-reflection layer 120.

Figure 3D:
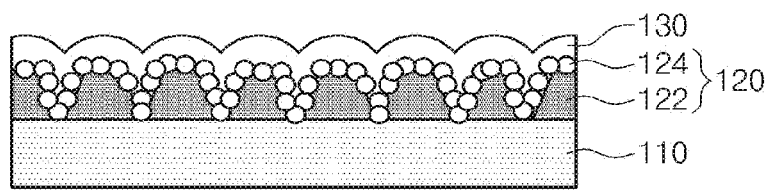

Referring to FIG. 3D, a first electrode 130 may be formed on the nanoparticle layer 124. The first electrode 130 may be formed as a transparent conductive oxide. The first electrode 130 may be formed of the same material as that of the nanopattern 122. The first electrode 130 may have a refractive index higher than that of the nanoparticle layer 124. Accordingly, the nanoparticle layer 124 can prevent light from being reflected.

Figure 6A:
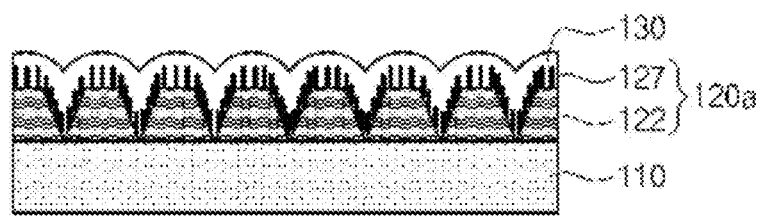
FIG. 6A is a cross-sectional view illustrating a method of forming a solar cell, according to another embodiment of the present invention.
Figure 6B:
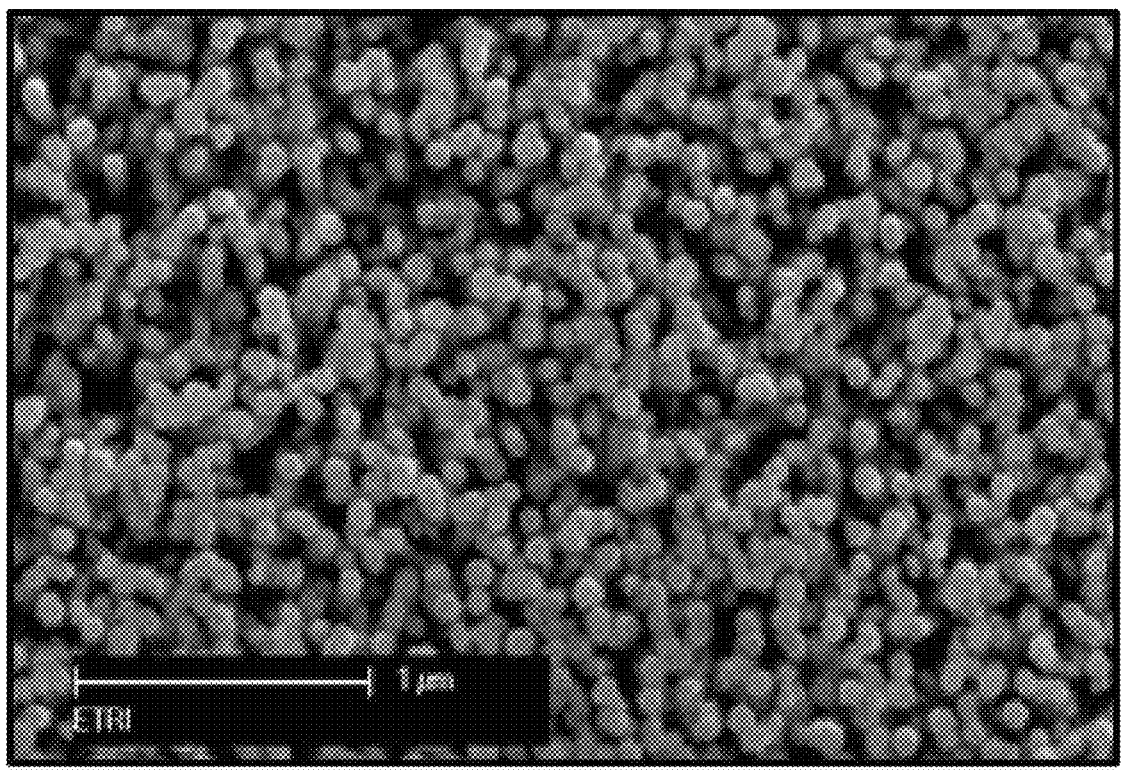
FIGS. 6B and 6C are images illustrating a state where a nanorod layer to be described below has been formed.
Figure 6C:
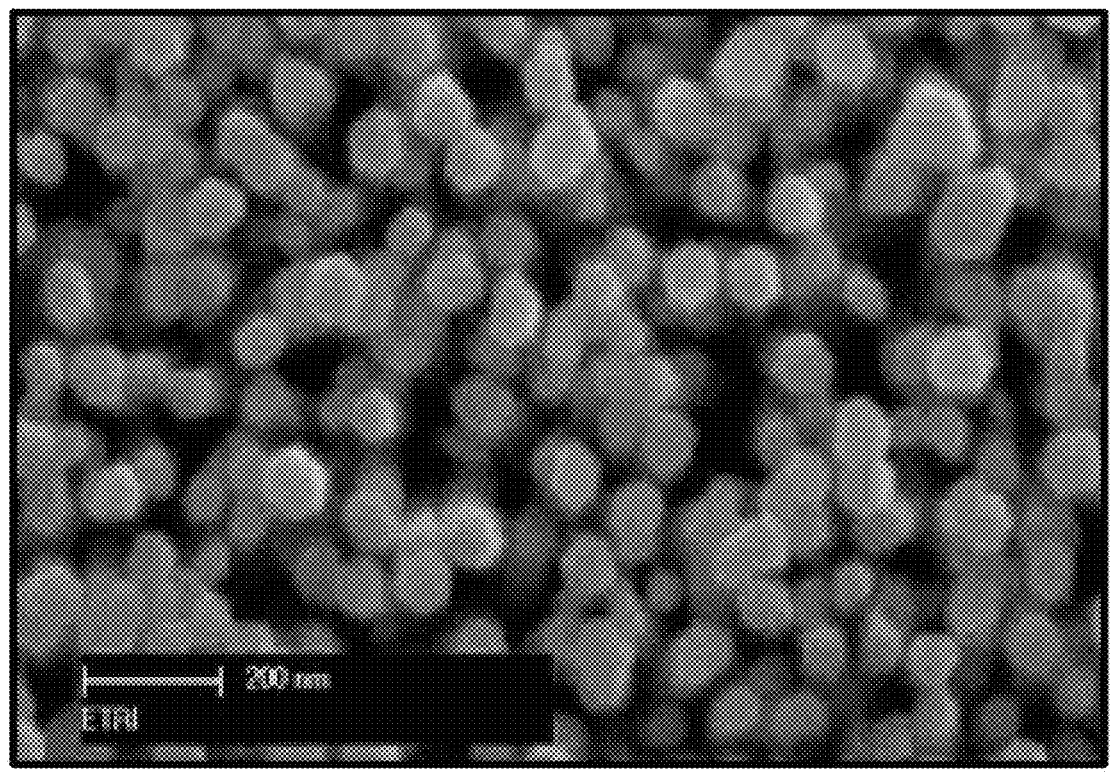

FIG. 6A is a cross-sectional view illustrating a method of forming a solar cell, according to another embodiment of the present invention. FIGS. 6B and 6C are images illustrating a state where a nanorod layer to be described below has been formed (FIG. 6C is an enlarged view of FIG. 6B). Hereinafter, for conciseness, the technical features that have been described above with reference to FIGS. 3A and 3D will be omitted.

Referring to FIG. 6A, a nanorod layer 127 may be formed on a nanopattern 122. The nanorod layer 127 may be formed by growing the nanoparticle layer 124 using the nanoparticle layer 124 (see FIG. 3C) as a seed layer. Since the nanorod layer 127 has a refractive index lower than that of the first electrode 130, it causes destructive interference (or decreases an interference fringe), thereby reducing the reflection of light. The nanorod layer 127 and the nanopattern 122 may configure an anti-reflection layer 120.

Figure 7:
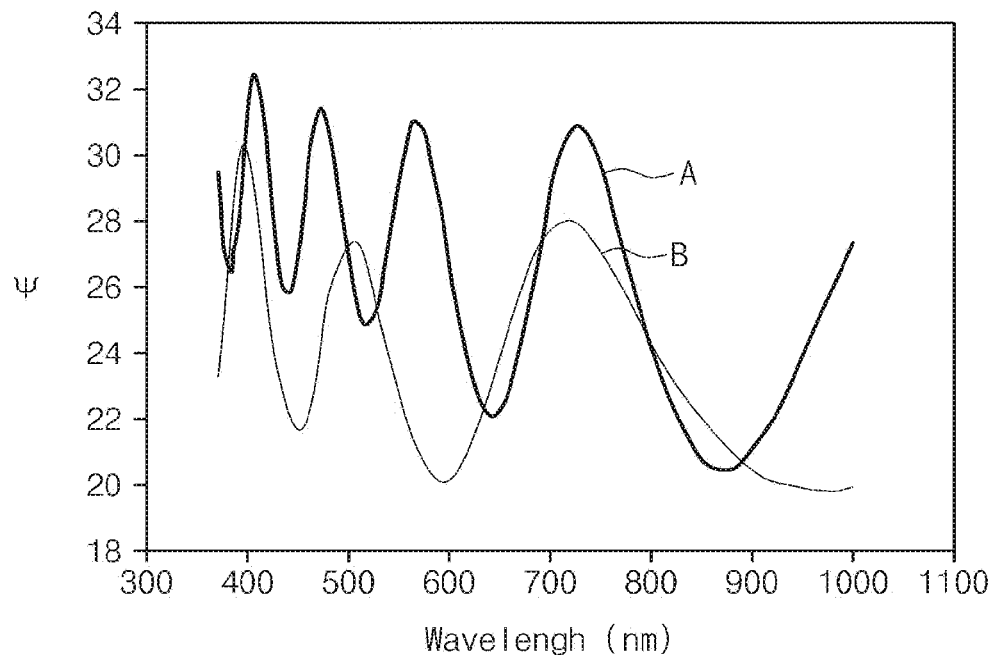
FIG. 7 is a graph showing that a reflection rate is reduced by nanopatterns which are formed according to an embodiment of the present invention.

FIG. 7 is a graph showing that a reflection rate is reduced by nanopatterns which are formed according to an embodiment of the present invention.

Referring to FIG. 7, a case A that does not pattern the transparent conductive oxide layer 121 is compared with a case B that forms the nanopattern 122 by patterning the transparent conductive oxide layer 121. In the case B of forming the nanopattern 122, it can be seen that oscillation of a value Psi($\psi$) measured in an ellipsometer is reduced. This can be understood as that the trapping of light increases in the surface of the nanopattern 122 and thus reflection of light decreases, in the case B of forming the nanopattern 122.

Figure 8:
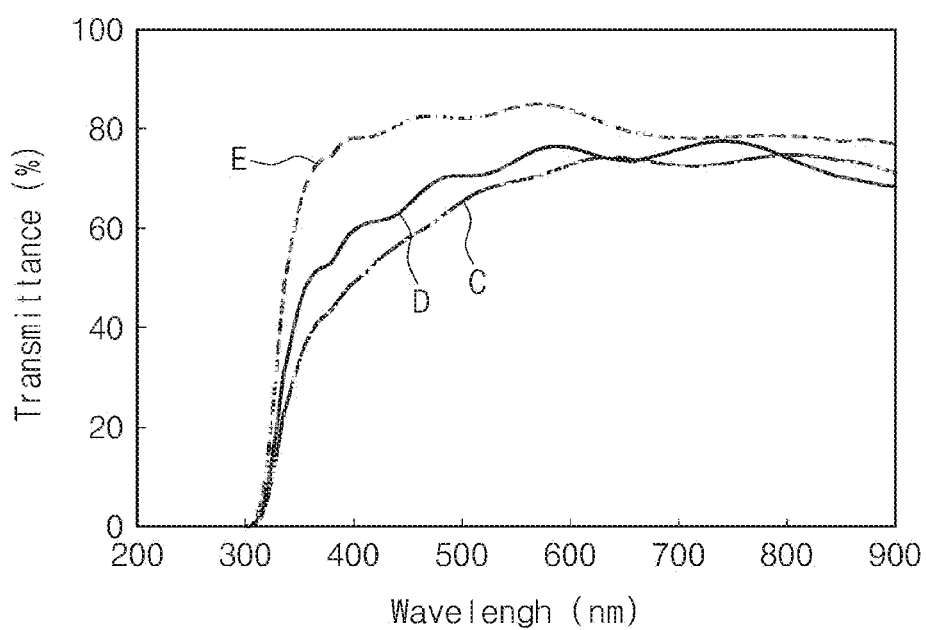
FIG. 8 is a graph showing change of transmittance in accordance with a wavelength, in a solar cell according to an embodiment of the present invention.

FIG. 8 is a graph showing change of transmittance in accordance with a wavelength, in a solar cell according to an embodiment of the present invention.

FIG. 8 shows a case C that does not pattern the transparent conductive oxide layer 121, a case D that forms a nanopattern by patterning the transparent conductive oxide layer 121, and a case E that forms a nanoparticle layer with zinc oxide and a nanopattern. In a short wavelength (350 to 600 nm), the case E of forming the nanopattern and the nanoparticle layer shows the highest transmittance, and the case D of forming the nanopattern shows transmittance higher than that of the case C that does not pattern the transparent conductive oxide layer 121. This can be understood as that the anti-reflection layers according to embodiments of the present invention decrease loss due to reflection of light and thus enhance transmittance.

Figure 9:
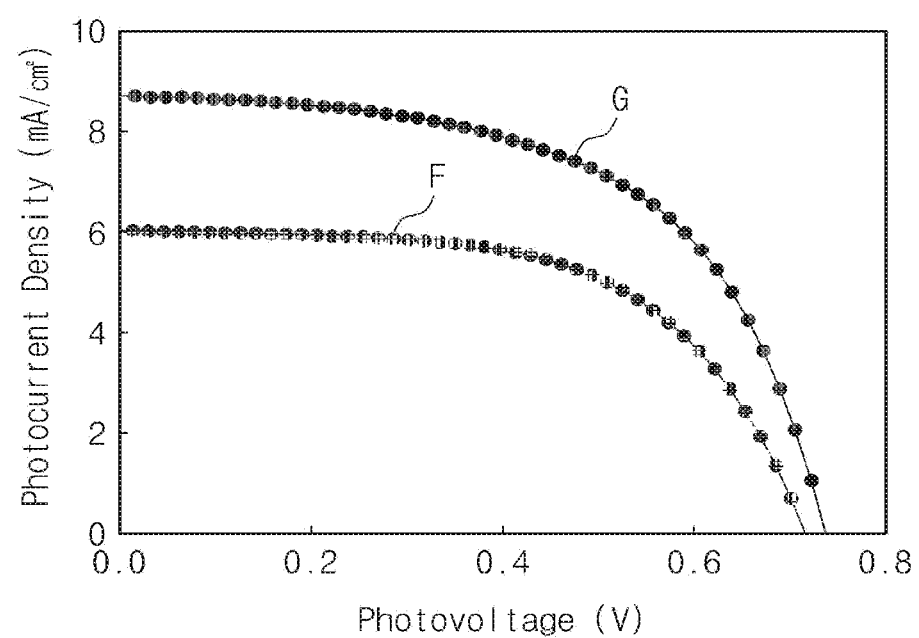
FIG. 9 is a graph showing a photocurrent density of a solar cell according to an embodiment of the present invention.

FIG. 9 is a graph showing a photocurrent density of a solar cell according to an embodiment of the present invention.

Referring to FIG. 9, it can be seen that the photocurrent density of a case G of providing an anti-reflection layer according to an embodiment of the present invention more increases than that of a case F which does not provide the anti-reflection layer. In the graph of FIG. 9, the photocurrent density of the case F that does not provide the anti-reflection layer is about 6.03 mA/cm$^2$ and the photocurrent density of the case G according to an embodiment of the present invention is about 8.73 mA/cm$^2$. Moreover, the solar cell efficiency of the case F that does not provide the anti-reflection layer is about 2.54%, and the solar cell efficiency of the case G that provides the anti-reflection layer is about 3.66%. That is, the solar cell efficiency of the case G has increased by about 40% compared to the case F.

According to embodiments of the present invention, the solar cell includes an anti-reflection layer that has the nanopattern and the nanostructure on the substrate. The nanopattern can increase light transmissivity, and the nanostructure can minimize the reflection loss of light due to destructive interference. Accordingly, the solar cell has the nanopattern and the nanostructure, thereby enhancing a light absorption rate and efficiency.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A solar cell comprising:
   a substrate;
   an anti-reflection layer on the substrate;
   a first electrode on the anti-reflection layer;
   a photo-electro conversion layer on the first electrode; and a second electrode on the photo-electro conversion layer, wherein:

the anti-reflection layer comprises a nanopattern and a nanostructure, and the anti-reflection layer is disposed between the substrate and the first electrode, such that a lower surface of the nanopattern comes in contact with the substrate, the nanostructure is disposed on an upper surface of the nanopattern;

the nanopattern comprises a transparent conductive oxide;

the nanostructure comprises a nanoparticle layer;

the nanoparticle layer includes a plurality of nanoparticles that are covered by and come in contact with the first electrode; and the nanoparticle layer comprises different material from the nanopattern.

2. The solar cell of claim 1, wherein the nanopattern comprises fluorine-doped tin oxide.

3. The solar cell of claim 1, wherein the nanopattern has a shape of a nanopillar having a concave-convex part.

4. The solar cell of claim 1, wherein the nanostructure comprises zinc oxide.

5. The solar cell of claim 1, wherein a nanopore is formed in the nanoparticle layer.

6. The solar cell of claim 1, wherein the nanostructure comprises a nanorod layer.

7. The solar cell of claim 1, wherein the nanopattern and the first electrode comprise the same material.

8. The solar cell of claim 7, wherein the nanopattern and the first electrode comprise a transparent conductive oxide.

9. The solar cell of claim 1, wherein the photo-electro conversion layer comprises:

a semiconductor electrode layer on the first electrode; and an electrolyte layer on the semiconductor electrode layer.

10. The solar cell of claim 1, wherein:

the substrate includes an outer surface and an inner surface, wherein light from outside enters the outer surface, passes through the substrate, and then exits out of the inner surface;

the nanopattern is disposed on the inner surface of the substrate and has an outer surface and an inner surface, wherein light from the substrate enters the outer surface, passes through the nanopattern, and then exits out of the inner surface; and the nanoparticles are disposed on the inner surface of the nanopattern.

* * * * *